United States Patent [19]

Loucks

[11] 4,032,843

[45] June 28, 1977

[54] COMPENSATED SIGNAL ISOLATOR

[75] Inventor: Richard S. Loucks, Northridge, Calif.

[73] Assignee: International Telephone and Telegraph Corporation, New York, N.Y.

[22] Filed: June 21, 1976

[21] Appl. No.: 698,128

[52] U.S. Cl. .................................. 324/96; 250/551; 330/59
[51] Int. Cl.² ...................................... G01R 31/00
[58] Field of Search ...................... 324/96; 330/59; 250/551

[56] References Cited
UNITED STATES PATENTS 3,854,089  12/1974  Emler .................................. 324/96
3,943,367  3/1976  Baker ............................... 324/96 X Primary Examiner—Stanley T. Krawczewicz
Attorney, Agent, or Firm—William T. O'Neil

[57] ABSTRACT

A device for coupling a signal value out of a circuit which itself is floating at some relatively high voltage (termed common-mode voltage). A sensor for converting the parameter to be measured to a signal voltage, together with an amplifier and light-emitting diode are powered by a floating power supply of minimal power rating at the location of the common-mode voltage. An optical fiber link, which itself has great electrical insulation characteristics, joins the LED with a solid state light-to-electric transducer at a relatively remote location. Circuit means responsive to the light-to-electric transducer are included for outputting an analog value representative of the quantity to be measured at the point of the common-mode voltage. This LED, fiber optic link and light-to-electric transducer constitute a first OCI (optically coupled isolator). An additional OCI having the same characteristics as the first is located at the remote point and includes a second LED, optical fiber linked and a second light-to-electric transducer which generates a signal representative only of the extraneous variations produced through the first OCI. The resulting signal is differentially added as a feedback term to the signal produced by the first OCI to provide a compensated analog signal output.

12 Claims, 5 Drawing Figures

COMPENSATED SIGNAL ISOLATOR

BACKGROUND OF THE INVENTION

1. Field of the Invention

The invention relates to electrical quantity measurement, and more particularly, to such measurement of relatively small variations in the environment of a relatively large common-mode voltage.

2. Description of the Prior Art

The problem of measuring or coupling out a low-level signal across a high potential difference is an old problem which has been approached in various ways in the prior art. Basically, it is always necessary to use an isolating signal coupling of one type or another.

A typical example of the situation in which prior art instrumentations have been applied (and to which the present invention is also applicable) arises when current in a conductor must be monitored, but where the conductor itself is floating at some relatively high and possibly variable voltage. This floating voltage is sometimes referred to as a common-mode voltage. Among the techniques which have been used in the prior art to effectively reject these common-mode voltages while measuring the floating parameter, include the magnetically coupled current transformer, the differential amplifier, and various systems which convert the floating parameter to be measured into another form of radiatable or conductable signal which can be monitored at a remote point.

Probably the simplest device for the purposes, and one which is especially adapted to current measurement in the environment of at least moderately high common-mode voltage, is the current transformer having a core of magnetic material (frequently of torroidal form) through which the conductor carrying the current to be monitored passes, in effect as a single turn primary. A secondary winding on the magnetic core then produces a signal which is a function of the varying current to be monitored. The transformer primary-to-secondary insulation frequently including an air-gap around the high voltage conductor, provides the need isolation. Unfortunately, the inherently limited low frequency response of this type of transformer coupling severely limits its utility for wide current pulses or where the DC current componet (steady state value) must be included in the measurement.

The differential amplifier device has the inherent capability of amplifying the difference between two inputs while ignoring the actual common-mode voltage relative to ground. Typically, such a differential amplifier might have as its inputs the two ends of a meter shunt or standard resistance element inserted in series with the aforementioned conductor for current monitoring. Where the common-mode voltage is relatively low (for example 50 volts or less) or where the signal differential across the sensing element is relatively large, the differential amplifier technique can often be used with satisfactory results. Otherwise, it must be expecially designed for the application, and even then, practical differential amplifiers have limited accuracy due to drift and zeroing errors which are especially troublesome where the small signals must be "sorted out" from a relatively high common-mode voltage. If the common-mode voltage is quite high (hundreds or thousands of volts) then amplifier insulation problems must also be dealt with.

A relatively new device for isolated signal transmission is available as a subassembly and is used in the combination of the present invention. This device is the so-called optically coupled isolator (OCI). In its basic form, a light-emitting diode or similar electric-to-light transducer provides a light source of intensity porportional to the signal being monitored and this output is coupled to a photosensitive device via an optical path, frequently in the form of a fiber optic bundle of at least one optical fiber. Since the optical path is inherently an insulating medium of very high resistivity, such a device has a capability for isolating the large common-mode voltage. Insulation resistances on the order of $10^{12}$ ohms or more are readily achieved and very low capacitances are exhibited (one picofarad or less). Those values of resistance and capacitance are easily realized at common-mode voltages on the order of 2500 volts dc with transients of 1000 volts per microsecond.

A commercially available OCI includes the light-emitting diode and photo transistor or photo diode with amplifying transistor coupled thereto at input and output ends, respectively, of an optical fiber link. Such a commercial device is available, as the HP 5082–4354, manufactured by Hewlett Packard Company of Palo Alto, Calif., for example.

The OCI per se, however, does have an important disadvantage used in its obvious form, this being the inherent non-linearity of the semiconductor elements used i.e., the LED and photo-transistor or photodiode elements which act as input and output transducers, respectively, for the length of optical fiber.

If the application requires a highly linear relationship between input and output, it is necessary to severely limit the dynamic range over which the unit operates. This inevitably leads to very low output levels and complex networks for the compensation of thermal and other effects which might otherwise mask the desired measurement.

The manner in which the present invention employs the OCI to obtain its inherent advantages of frequency response extending down to dc, and the very high order of insulation against the common-mode voltage, will be understood as this description proceeds.

SUMMARY OF THE INVENTION

The device of the present invention may be referred to as a compensated optical coupler arrangement which avoids the difficulties of the prior art hereinabove recited to produce a novel combination of superior performance.

Specifically, a signal to be measured is applied to the LED at the input end of an optical fiber link, all components at this sending end floating at the common-mode voltage. The photo-transistor or other light-to-electrical transducer at the receiving end of the fiber optic link is very effectively isolated from the common-mode voltage by the insulating qualities of the fiber optic link, and consequently, these "receiving" components may be referenced to ground at the remote point, independently.

According to the invention a second OCI subassembly comprising another LED, fiber optic link and photo-transistor, is used to provide a compensating signal which is mixed in a differential amplifier arrangement (or the equivalent thereof) with the output end of the photo-transistor (of other light-to-electrical transducer) at the output end of the first optical fiber link. The result is compensation for the disadvantageous characteristics aforementioned which are inherent in the OCI device, all accomplished at the "receiving" end which, although referred to as the "remote" location may actually be physically close to the conductor or other device in connection with which the measurement is to be made. Similarly, the optical fiber length may be extended substantial distances therefrom, the device performing a classical "telemetering" function over some predetermined distance above or below ground or water surface.

DESCRIPTION OF THE PREFERRED EMBODIMENT

Figure 1:
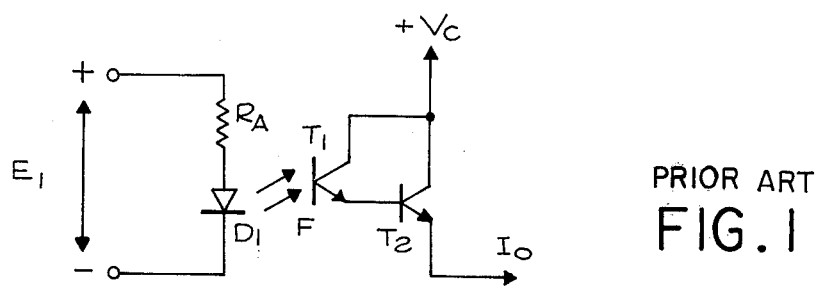
FIG. 1 is a circuit diagram of an elementary OCI.

At the outset, FIG. 1 is referred to in order to describe certain basic characteristics of the so-called OCI device. A typical OCI including the aforementioned commercially available OCI manufactured by Hewlett Packard Company of Palo Alto, Calif. under the Catalog HP 5082–4354, includes not only a fiber optic light energy conductor F, but also a transducer such as a light-emitting diode D1 and a photo diode or phototransistor T1 which serve as input and output transducers. The LED D1 is energized from the electrical quantity $E_1$ which it is desired to monitor through a series resistor $R_a$ chosen according to known criteria. Thus, the LED operates as an electrical-to-light transducer, sending a light signal which is the analog of $E_1$ over the fiber optic path F to the photo-transistor $T_1$. Quite obviously, the photo-transistor $T_1$ and all circuits thereafter on FIG. 1 are isolated electrically from the signal $E_1$ which may have a relatively large associated common-mode voltage. Photo-transistor $T_1$ is shown in FIG. 1, with an additional transistor $T_2$ acting as a current amplifier so that a current $I_o$ is drawn from the source $V_c$ to load or measuring device the latter having a ground return path with respect to the source $V_c$. The source $V_c$ may be a small battery, for example, since the total power required of it is very low.

Figure 5:
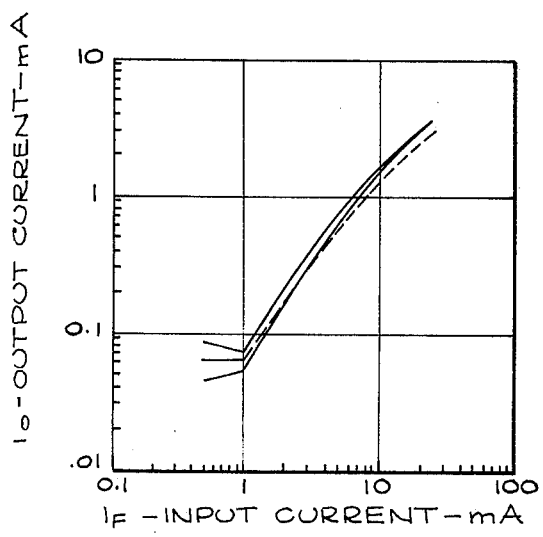
FIG. 5 is a graph depicting elementary OCI transfer characteristics for several temperatures.

An analysis of the circuit of FIG. 1 follows:

Assume that the basic OCI has a transfer function F(i), of input current to output current defined as monotonic with no singularities over the range $I_1$ to $I_2$. FIG. 5 shows this function for one commercially available OCI, the aforementioned HP 5082-4354.

If this OCI is connected as shown in FIG. 1, the output is given as:

$$I_o = (F(i) * E_1/R_1) I, E_1/R < I_2$$

Where $I_o$ = Output current
$F(i)$ = OCI transfer function
$E_1$ = voltage (signal
$R_1 = D_1$ current limiting resistor $I_1$ = A current sufficient to ensure stable conduction in $D_1$ (monotonicity). For the HP 5082-4354, $I_1$ is chosen as 100 $\mu$ amperes.

$I_2$ = Maximum current rating of $D_1$. For the circuit as shown, $I_2$ was chosen as 5 ma.

Figure 2:
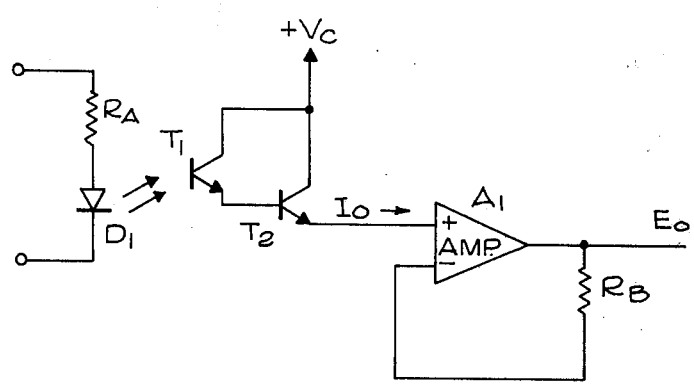
FIG. 2 is a second OCI circuit arrangement, including a differential current amplifier, such that an output voltage is derived as a function of the value of the feedback resistor.
Figure 3:
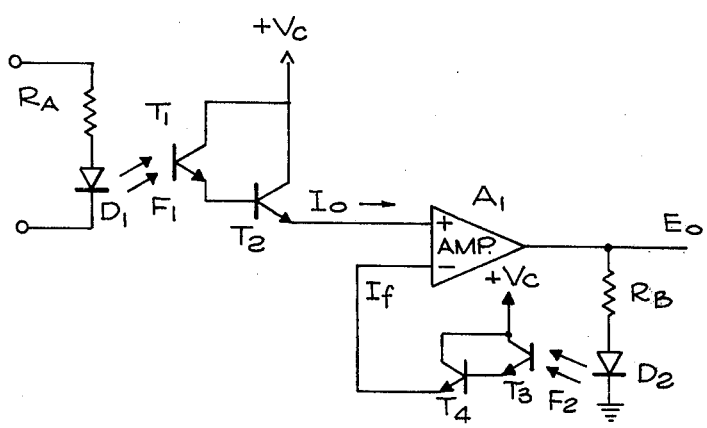
FIG. 3 is a circuit expanding on FIG. 2 according to the invention through addition of a second OCI circuit in the feedback circuit of the differential amplifier.

The addition of a differential current amplifier as shown in FIG. 2 provides a voltage output essentially defined by the resistor $R_B$. Since the current fed back to the inverting terminal (−) of the amplifier must, within the amplifier operating range, be equal and opposite to that being supplied to the noninverting (+) terminal, we find that:

$$I_o = (E_o/R_B)$$

or $$E_o = I_o \times R_B$$

Where $E_o$ = Output voltage
$I_o$ = Current output from the OCI
$R_B$ = Value of the feedback resistor If, as in FIG. 3, we now insert a second OCI effectively in series with $R_B$, the feedback current $I_f$ (which must be equal in amplitude and polarity to $I_o$) becomes:

$$I_f = [F(i) * E_o/R_B]$$

where $I_f$ = feedback current
or $$E_o = [I_f * R_B/F(i)]$$

but $$I_f = I_o = [F(i) * E_1/R_1]$$

therefore $$E_o = [F(i) * E_1/R_1] \times [R_B/F(i)]$$

and if $R_1 = R_2$, then $F_o = E_1$.

Concerning the question as to the validity of F(i) as the transfer function for both OCI's it is noted that there are commercially available OCI assemblies as packaged pairs of OCI's in a single dual-in-line package, thereby minimizing temperature differences and, since the circuit inherently operates both OCI's at the same input/output levels, tracking over the range of interest is adequate.

Figure 4:
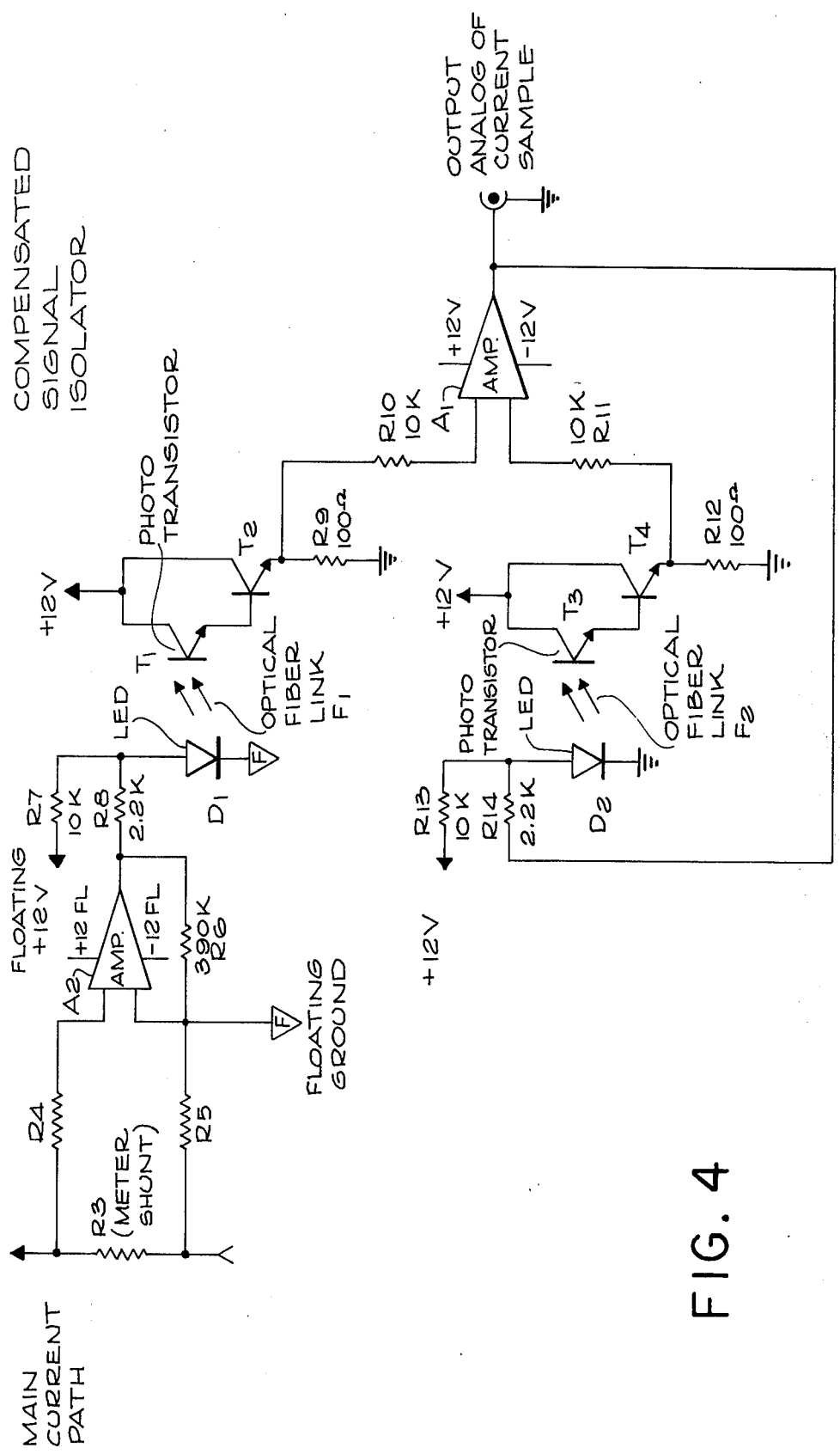
FIG. 4 is a complete circuit of a compensated signal isolator arrangement in accordance with the present invention.

Referring now to FIG. 4, a fully detailed circuit according to the inventor is shown. The application, for which the circuit of FIG. 4 was designed, required monitoring of pulse currents of 450 amperes peak at pulse widths from 20 to 500 microseconds. The current sample point was floating at an average voltage of 250 vdc, with ripple components of 60hz and 360 hz. In the circuit of FIG. 4, no evidence of coupling through of the supply (common mode) voltage was noted.

Since very little voltage could be dropped in the sensor (meter shunt) due to the high currents involved, the input to the compensated coupler was limited to 500 millivolts, derived from a 1000 microohm sensor. To accommodate this situation, a preamplifier $A_2$ to drive the isolating OCI ($D_1$, $F_1$, and $T_2$ combination) is provided. Overall gain is set in this stage $A_2$ by the feedback resistor $R_B$.

An additional current source ($R_7$ in FIG. 4) was added to ensure that the current in the isolating OCI diode $D_1$, was always above 100 microamperes ($I_1'$). A similar resistor $R_{13}$ is included for the feedback OCI, ($D_2$, $F_2$, and $T_3$).

The circuit of FIG. 4 embodies the device developed step-by-step in FIGS. 1, 2 and 3, with the addition of the preamplifier as aforementioned.

Some typical values for the circuit parameters for FIG. 4 for the current measuring application described are as follows:

$R_3$ 500µΩ(meter shunt)
$R_4$ 10kΩ
$R_5$ 10kΩ
$R_6$ 390kΩ
$R_7$ 10KΩ
$R_8$ 2.2kΩ
$R_9$ 100Ω
$R_{10}$ 10kΩ
$R_{11}$ 10kΩ
$R_{12}$ 100Ω
$R_{13}$ 10kΩ
$R_{14}$ 2.2kΩ
$A_1$ EIA type 741 differential
$A_2$ amplifier (solid-state)
$D_1/F_1/T_1$ Hewlett-Packark
$D_2/F_2/T_3$ cat. number HP 5082-4354

The value of the meter shunt resistance $R_3$ in the type of system contemplated is usually quite small in order to minimize the effect on the main current path in which it is inserted. Accordingly, the voltage extant across $R_3$ is relatively small as hereinbefore indicated, and accordingly, an amplifier $A_2$ has been inserted to provide a larger drive signal for the LED $D_1$ which is the input transducer of a first optically coupled isolator comprising $D_1$, $F_1$, and $T_1$. The transistor $T_2$ being responsive to the output of photo-transistor $T_1$, is chosen to be consistent with the characteristics of $T_1$ and is inserted to provide further amplification into the differential amplifier $A_1$.

In summarizing the operation of the compensating feedback in accordance with the present invention, it is again reiterated that the transfer characteristics or transfer function of the sub-combination comprising $B_1$, $F_1$, and $T_1$ is essentially the same, or substantially the same, as that of the sub-combination comprising $D_2$, $F_2$, and $T_3$. The circuit parameters and supply voltages for this second optically coupled isolator subassembly are the same as those for the first subassembly, however the second such OCI sub-combination receives as an input only the output of the differential amplifier $A_1$. The outputs of $T_2$ and $T_4$ are supplied to the differential amplifier $A_1$ through equal resistors $R_{10}$ and $R_{11}$ providing for input impedances to $A_1$ which are substantially the same.

It will be realized that in view of the correspondence in transfer functions between the two optically coupled isolator subassemblies, the output of $A_1$ is effectively linearized and made independent of the variations of transfer function through the first isolator subassemblies, the output of $A_1$ is effectively linearized and made independent of the variations of transfer function through the first isolator subassembly which carries the useful signal from the sensor R3.

An understanding of the circuit of FIG. 4 as hereinabove described, will provide the skilled reader with an understanding of the principles of the present invention. Accordingly, modifications and variations on the circuit of FIG. 4 will suggest themselves to those skilled in this art. It is therefore not intended that the scope of the present invention should be considered to be limited by the drawings or by this description, these being intended to be typical and illustrative only.

What is claimed is:

1. A device for monitoring an electrical parameter associated with a common-mode voltage, said device generating an analog signal independent of said common-mode voltage and representing said electrical parameter at a remote location, comprising:
    a sensor responsive to said electrical parameter to provide a first electrical signal as a first function thereof;
    first means comprising a first optically coupled isolator responsive to said first electrical signal for generating a second signal representative of said first signal at a remote location independent of said common-mode voltage;
    and second means responsive to said second signal including a second optically coupled isolator substantially identical to said first isolator, said second isolator being connected in a feedback arrangement within said second means in a manner compensating said second signal for variations in the transfer function of said first isolator.

2. Apparatus according to claim 1 in which said second means comprises a differential amplifier having a first input responsive to said second signal and a second input responsive to the output of said second isolator, said second isolator taking its input only from the output of said differential amplifier.

3. Apparatus according to claim 2 in which said electrical parameter to be monitored is a variable current, said sensor is a fixed low value resistance element arranged such that said variable current flows therethrough, and said first signal is a voltage drop generated across said sensor continuously proportional to the amplitude of said variable current.

4. Apparatus according to claim 2 in which said optically coupled isolators each include an electrical-to-light first transducer, a light-to-electrical second transducer, and electrically insulating light transmissive element for directing light from said first transducer to said second transducer.

5. Apparatus according to claim 4 in which said light transmissive element comprises a predetermined length of fiber optic cable having at least a single optical fiber.

6. Apparatus according to claim 4 in which said first transducer is a light emitting diode and said second transducer is a photo-transistor.

7. Apparatus according to claim 5 in which said first transducer is a light emitting diode and said second transducer is a photo-transistor.

8. Apparatus according to claim 1 in which said optically coupled isolators each include an electrical-to-light first transducer, a light-to-electrical second transducer, and electrically insulating light transmissive element for directing light from said first transducer to said second transducer.

9. A device for monitoring an electrical parameter associated with a common-mode voltage, said device generating an analog signal independent of said common-mode voltage and representing said electrical parameter at a remote location, comprising:
    a sensor responsive to said electrical parameter to provide a first electrical signal as a first function thereof;
    first means responsive to said first signal for generating a light energy signal as a function of said first signal;
    optical transmission means responsive to said light energy signal for conveying said light energy signal to said remote location, said optical means having electrical insulating qualities;

second means responsive to said optical transmission means at said remote location for generating a second electrical signal as a second function of the amplitude of said light energy signal at said remote location;

third means comprising a differential amplifier having first and second inputs and an output, said first differential amplifier input being connected to respond to said second electrical signal and said output providing said analog signal;

and fourth means comprising a second subcombinaton substantially identical with the first sub-combination which includes said first means, said optical transmission means, and said second means, said first and second sub-combinations having substantially the same transfer function, said second sub-combination being connected as a feedback network between said second input and said output of said third means.

10. Apparatus as defined in claim 9 in which said optical transmission means of said first and second sub-combinations are fiber optic elements.

11. Apparatus according to claim 10 in which said electrical parameter is a current in a conductor associated with said common-mode voltage, said sensor is a resistance element arranged in series with said current, said first electrical signal being the relatively small voltage signal extant across said sensor as a function of said current, the resistance value of said sensor being low so as to minimize the effect thereof on the circuit carrying said current, and in which amplifier means are included between said sensor and said first means.

12. Apparatus according to claim 11 in which said first means within each of said first and second sub-combinations comprises a light emitting diode and said second means in said subcombinations comprises a photo-transistor.

* * * * *